(12) United States Patent
Yagi et al.

(10) Patent No.: US 7,413,447 B2
(45) Date of Patent: Aug. 19, 2008

(54) ELECTRIC DISTRIBUTION BOX

(75) Inventors: Sakai Yagi, Makinohara (JP); Yoshiaki Ichikawa, Makinohara (JP); Shigeki Matsumoto, Makinohara (JP); Junta Katayama, Toyota (JP); Yasuyoshi Fukao, Toyota (JP)

(73) Assignees: Yazaki Corporation, Tokyo (JP); Toyota Jidosha Kabushiki Kaisha, Aichi (JP)

( * ) Notice: Subject to any disclaimer, the term of this patent is extended or adjusted under 35 U.S.C. 154(b) by 0 days.

(21) Appl. No.: 11/404,002

(22) Filed: Apr. 14, 2006

(65) Prior Publication Data

US 2006/0258185 A1    Nov. 16, 2006

(30) Foreign Application Priority Data

Apr. 15, 2005  (JP) ........................ P.2005-117692

(51) Int. Cl.
*H01R 12/00*     (2006.01)
(52) U.S. Cl. .................... 439/76.2; 439/949
(58) Field of Classification Search ............. 439/76.2, 439/949
See application file for complete search history.

(56) References Cited

U.S. PATENT DOCUMENTS 5,438,310 A * 8/1995 Ikari ........................ 337/208
5,795,193 A * 8/1998 Yang ..................... 439/620.27
6,322,376 B1 * 11/2001 Jetton ........................ 439/76.2
6,512,443 B1 * 1/2003 Matsumura et al. ......... 337/189

FOREIGN PATENT DOCUMENTS

JP        2004-282908       10/2004

* cited by examiner

*Primary Examiner*—Truc T. Nguyen
*Assistant Examiner*—Xuong Chung-Trans
(74) *Attorney, Agent, or Firm*—Finnegan, Henderson, Farabow, Garrett & Dunner, L.L.P.

(57) ABSTRACT

An electric distribution box includes a circuit which is operable to perform the flowing, interruption and detection of electric current, and the circuit having distribution parts and a first bus bar which connects the distribution parts, a case body in which the circuit is contained, and an external input/output terminal portion which is detachably mounted on an outer surface of the case body, and is adapted to be connected to the first bus bar.

7 Claims, 3 Drawing Sheets

ELECTRIC DISTRIBUTION BOX

BACKGROUND OF THE INVENTION

This invention relates to an electric distribution box used, for example, in a hybrid car, an electric car, a fuel cell car or the like so as to effect the flowing, interruption and detection of electric current, and more particularly to an improved structure of connecting the electric distribution box to the exterior.

There is already known a related electric distribution box in which distribution parts, such as an electromagnetic relay and a voltage sensor, are mounted within a case body so as to effect the flowing, interruption and detection of electric current.

In this electric distribution box, for example, a circuit is formed by the distribution parts and a bus bar electrically connecting these distribution parts, and this circuit is mounted within the case body formed by a lower case and an upper case, and the flowing, interruption and detection of electric current are effected.

Referring to one example of use, for example, in a hybrid car, an electric car or the like, a battery, an ignition switch, an inverter, etc., are arranged via this electric distribution box, and the electromagnetic relay is operated in response to an output signal from the ignition switch, and the inverter is caused to feed main electric power while the voltage sensor detects a condition of the battery (see, for example, JP-A-2004-282908 (Page 1, FIG. 1)).

Such an electric distribution box is connected to the constituent parts (including the battery, the inverter and so on) of the electrical system and constituent parts of a drive system via wire harnesses installed on a vehicle body frame.

Incidentally, this electric distribution box is mounted in a limited space within the vehicle in such a manner that its direction is predetermined. Therefore, the electric distribution box has the following problem.

Namely, the wire harnesses for connecting the constituent parts of the electrical system and drive system to the electric distribution box are not always installed in such a direction as to be easily connected to the electric distribution box.

Particularly when the kind of the vehicle varies, a connecting portion of the electric distribution box for connection to the wire harnesses often does not coincide with the direction of installation of the wire harnesses. In such a case, each wire harness is beforehand formed to have an extra length, and the wire harness is bent so as to be connected to the electric distribution box. Alternatively, an electric distribution box of different specifications is additionally prepared, and is connected to the wire harness. Thus, there has been a problem with respect to its mounting ability.

SUMMARY OF THE INVENTION

It is therefore an object of this invention to provide an electric distribution box which can be easily connected to a wire harness without additionally preparing an electric distribution box of different specifications even when a direction of installation of the wire harness varies.

The above object has been achieved by an electric distribution box of the present invention having the following features.

Namely, an electric distribution box of the invention comprises:

a circuit which is operable to perform the flowing, interruption and detection of electric current, and the circuit having distribution parts and a first bus bar which connects the distribution parts;

a case body, in which the circuit is contained; and an external input/output terminal portion which is detachably mounted on an outer surface of the case body, and is adapted to be connected to the first bus bar.

Preferably, the external input/output terminal portion is adapted to be connected to an external wire harness extending from an arbitrary direction.

Here, it is preferable that, the external input/output terminal portion includes a second bus bar. The second bus bar has a bus bar connecting portion for connection to an input/output terminal of the first bus bar, and an external connection portion for threaded connection to the external wire harness.

Preferably, the case body includes a lower case having a bracket portion that is formed so as to project horizontally from one end thereof, and an upper case detachably engaged with the lower case. The input/output terminal of the first bus bar is disposed at the bracket portion. The external input/output terminal portion is mounted on the bracket portion.

Here, it is preferable that a plurality of kinds of the external input/output terminal portions which are different from each other in the positional relation between the bus bar connecting portion and the external connection portion are prepared. In accordance with the external wire harness extending from an arbitrary direction, one of the plurality of kinds of external input/output terminal portions is selected, and is mounted on the bracket portion.

In the electric distribution box of the present invention, the case body, receiving the circuit for effecting the flowing, interruption and detection of electric current, is formed separately from the external input/output terminal portion for connection to the exterior. By using one of the external input/output terminal portions (which are different from each other in the position of the external connection portion (for connection to the external wire harness)) or the type of external input/output terminal portion having a plurality of external connection portions (for connection to the external wire harness) formed respectively at suitable portions thereof, the electric distribution box can be easily connected to the external wire harness without bending the external wire harness (which is formed to have an extra length) or without additionally preparing an electric distribution box of different specifications even when the external wire harness extends from such a direction that the external wire harness can not be easily connected to the electric distribution box.

And besides, the second bus bar, having the external connection portion for threaded connection to the external wire harness, is provided within the external input/output terminal portion, and this external input/output terminal portion is mounted on the outer surface of the case body, and by doing so, the electric distribution box can be easily and positively connected to the external wire harness.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Figure 1:
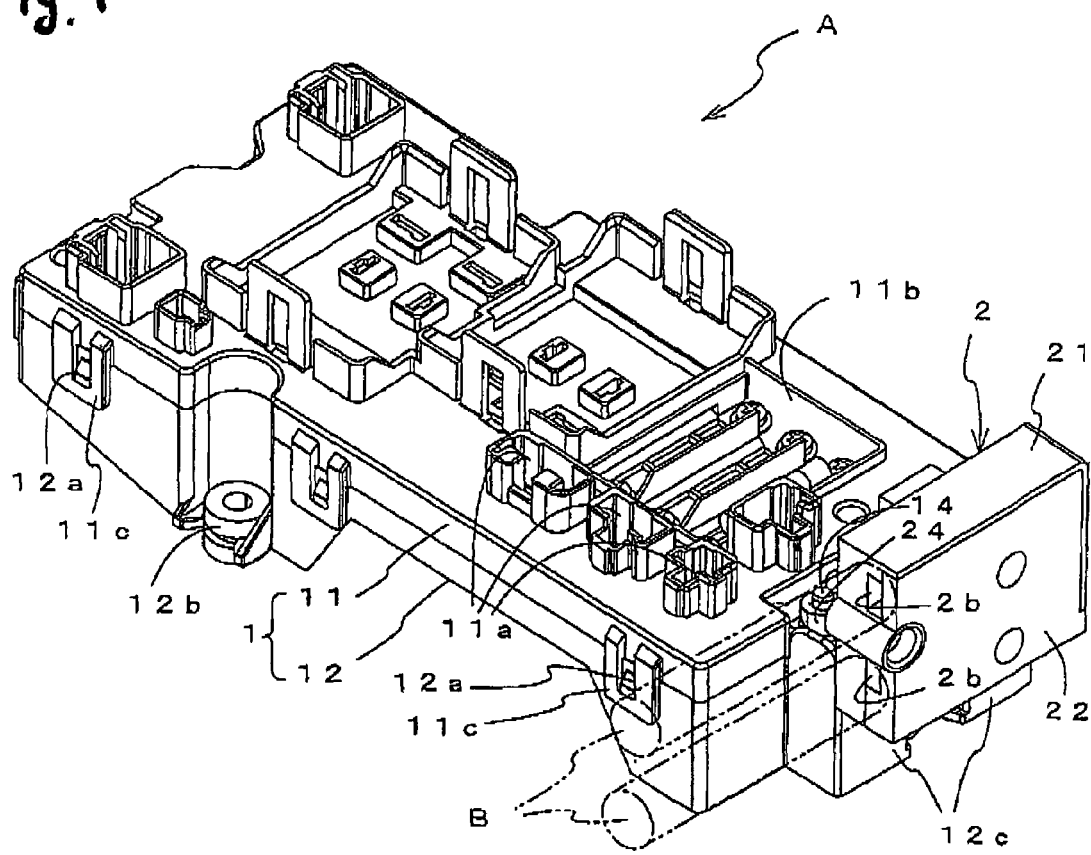
FIG. 1 is a perspective view showing a preferred embodiment of an electric distribution box of the present invention, showing its overall construction.

A preferred embodiment of an electric distribution box of the present invention will now be described with reference to the accompanying drawings. The electric distribution box of this embodiment is used in a hybrid car, an electric car, a fuel cell car or the like, and an electromagnetic relay, provided within the electric distribution box, is operated in response to an output signal from an ignition switch so as to cause an inverter to feed main electric power, and at the same time a voltage sensor detects a condition of a battery. In the drawings, reference character A denotes the electric distribution box, reference numeral 1 denotes a case body, and reference numeral 2 denotes an external input/output terminal portion.

The electric distribution box A of this embodiment comprises the case body 1 of a generally rectangular parallelepiped shape formed by an upper case 11 and a lower case 12, and the external input/output terminal portion 2 of a generally block-shape.

Connector holding portions 11a for respectively receiving and holding connectors (not shown) for electrical connection to the exterior are formed at an upper surface of the upper case 11, and also an opening portion 11 through which a fuse box (described later) is exposed is formed in the upper surface of the upper case 11. Retaining portions 11c care formed on a side surface of the uppercase 11.

A circuit for effecting the flowing, interruption and detection of electric current is formed by the distribution parts (now shown) (including the voltage sensor, the fuse box, the electromagnetic relay, etc.,) and a bus bar 13 electrically connecting these distribution parts, and this circuit is mounted or received within the lower case 12. Retaining engagement portions 12a are formed on a side surface of the lower case 12, and are engaged respectively with the retaining portions 11c, and the lower case 12 is detachably engaged with the upper case 11. Mounting portions 12b are formed at a lower portion of the side surface of the lower case 12, and each mounting portion 12b is adapted to be fixed to a mounting member (such as a frame of a vehicle) by a screw.

Figure 3:
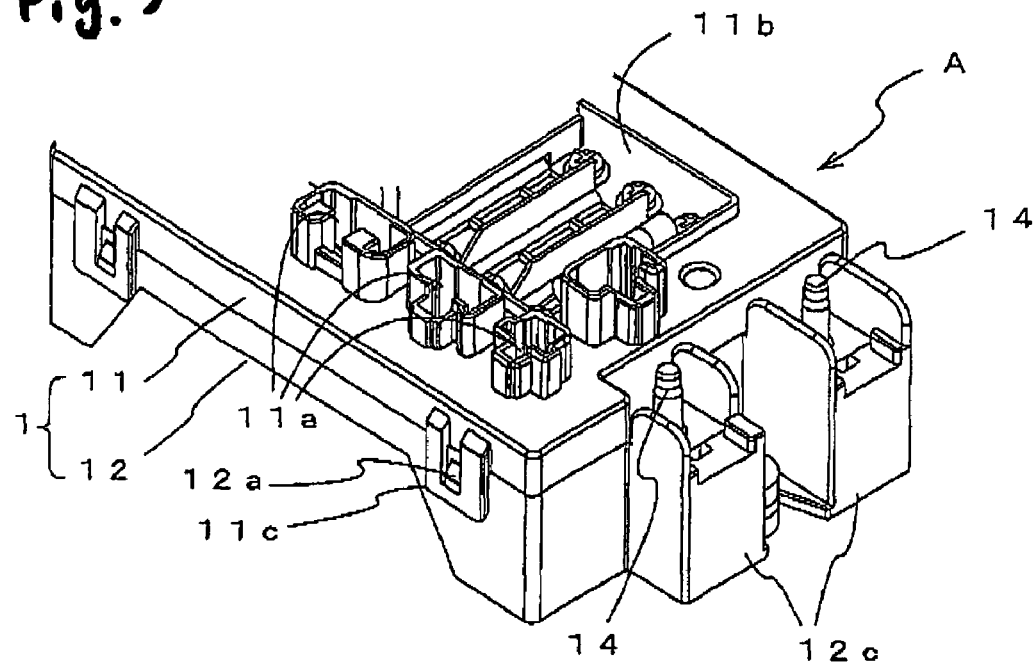
FIG. 3 is a perspective view of the important portion of the electric distribution box, with an external input/output terminal portion removed.

As shown in FIG. 3, a pair of bracket portions 12c are formed on and project horizontally from one end surface (right end surface in FIG. 3) of the lower case 12. Input and output terminals of the bus bar 13, forming the above circuit, are exposed to upper surfaces of the pair of bracket portions 12c. Threaded rods 14, extending respectively through the input and output terminals of the bus bar 13, are formed on and project from the upper surfaces of the bracket portions 12c.

Figure 2:
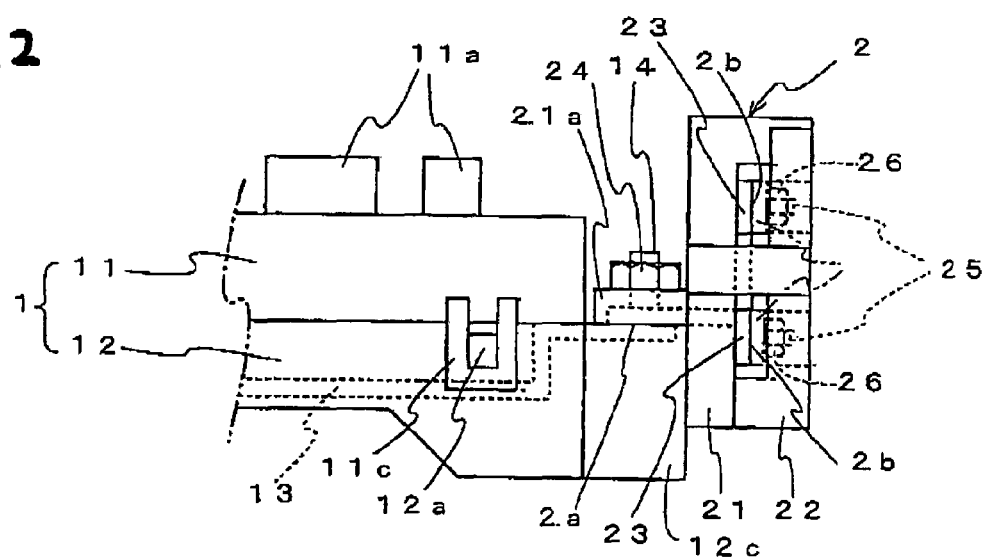
FIG. 2 is a front-elevational view of an important portion of the electric distribution box.

As shown in FIG. 2, the external input/output terminal portion 2 includes a container portion 21 having convex portions 21a formed on and projecting generally horizontally from a generally central portion (in the direction of the height) of one side surface thereof, and a lid portion 22 fitted to the container portion 21, the container portion 21 and the lid portion 22 jointly assuming the generally block-shape of the external input/output terminal portion 2. A second bus bar 23 for external input and output purposes is suitably bent, and is received and installed within the container portion 21. The second bus bar 23 includes bus bar connecting portions 2a which are disposed at bottom surfaces of the convex portions 21a so as to be electrically connected respectively to the input and output terminals of the bus bar 13, and external connection portions 2b which are electrically connected respectively to the bus bar connecting portions 2a, and can be electrically connected to the exterior.

Passage holes (not shown) are formed through the bus bar connecting portions 2a, and the threaded rods 14, projecting respectively from the upper surfaces of the bracket portions 12c, can pass through these passage holes, respectively. The threaded rods 14 are passed respectively through the passage holes, and nuts 24 are tightly threaded respectively on the threaded rods 14 projecting from the upper surfaces of the convex portions 21a, thereby mechanically and electrically connecting the external input/output terminal portion 2 to the bracket portions 11c.

Figure 4:
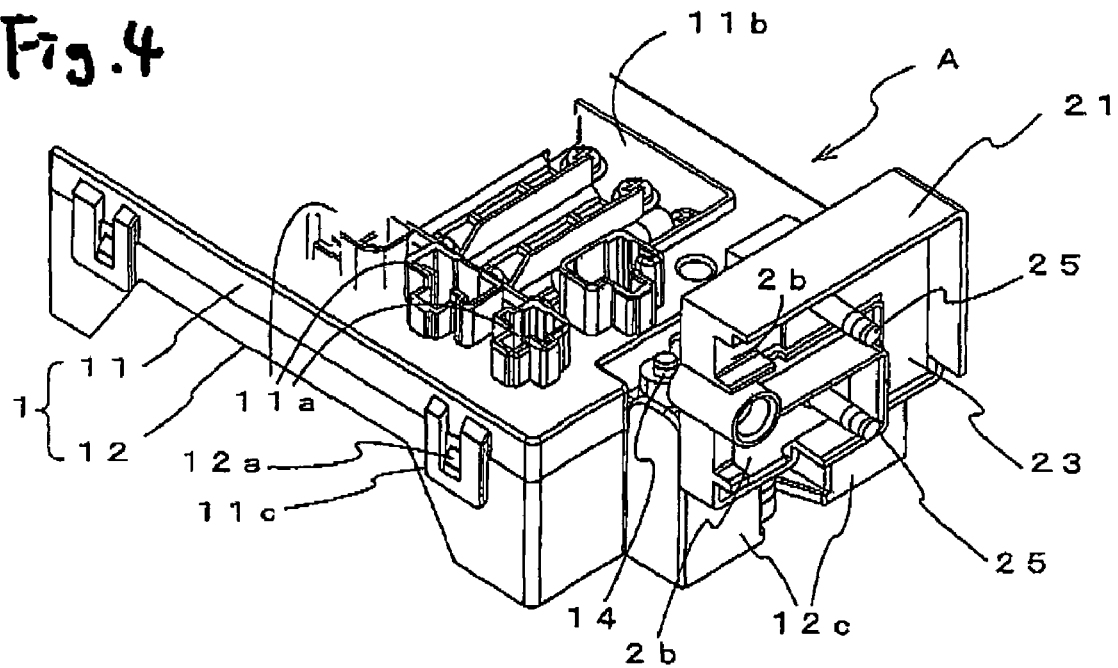
FIG. 4 is a perspective view of the important portion of the electric distribution box, with a lid portion of the external input/output terminal portion removed.

As shown in FIG. 4, threaded rods 25 are formed on and project respectively from the external connection portions 2b, and extend through an intermediate portion of the second bus bar 23 for external input and output purposes. The threaded rods 25 are passed respectively through end portions of wire harnesses B installed in the vehicle, and nuts 26 are tightly threaded respectively on these threaded rods 25, thereby electrically and mechanically connecting the end portions of the wire harnesses B to the second bus bar 23 for external input and output purposes.

The external input/output terminal portion 2 is provided in a direction perpendicular to the mounting surface of the bracket portions 12c (that is, in a direction perpendicular to the direction of projecting of the bracket portions 12c). However, the invention is not limited to this arrangement, and for example there is prepared another type of external input/output terminal portion 2' (as shown in FIG. 5) having external connection portions 2b' provided at an upper surface thereof generally opposed to the mounting surface of the bracket portions 12c, and in accordance with the direction of the wire harnesses B installed in the vehicle, one of the external input/output terminal portions 2 and 2' is selected, and is mounted on the bracket portions 12c so as to be easily connected to the wire harnesses B.

Figure 5:
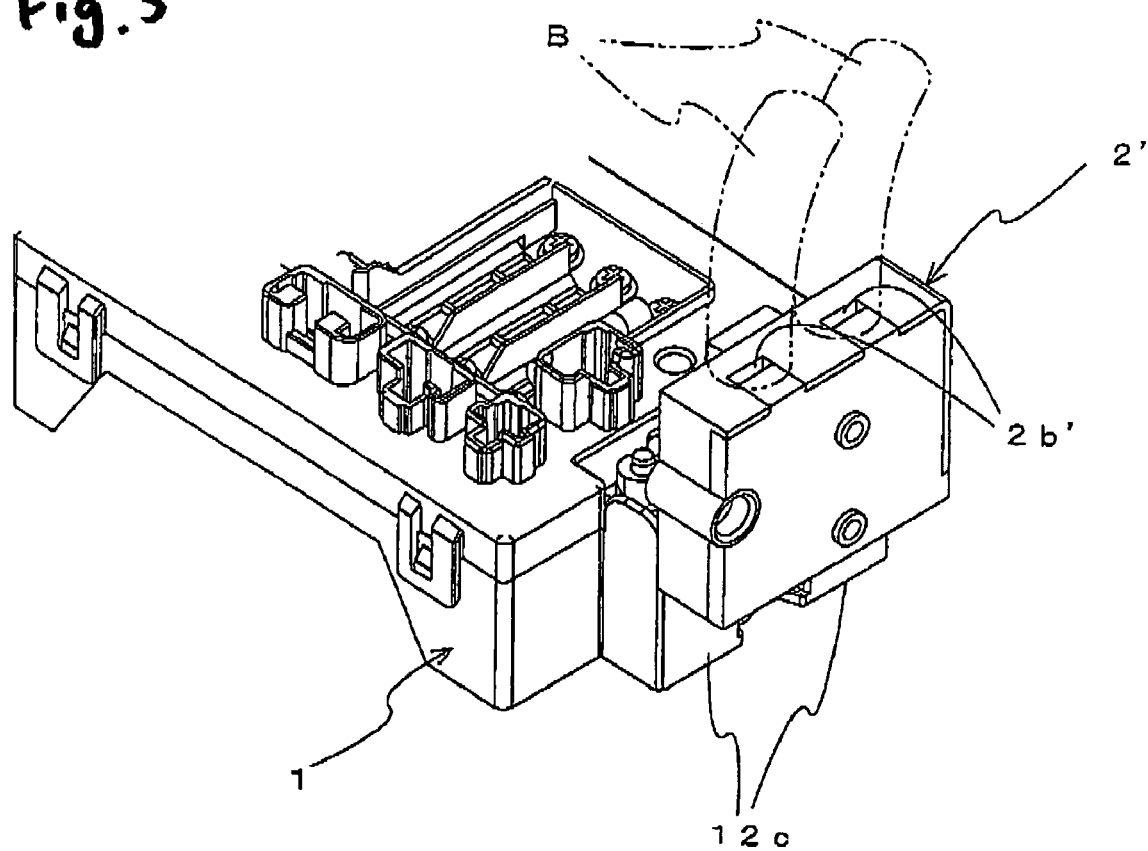
FIG. 5 is a perspective view of the important portion of the electric distribution box on which an external input/output terminal portion, having external connection portions disposed in a different position, is mounted.

The direction of the external connection portions 2b (2b') is not limited to those shown in FIGS. 1 and 5, and there are prepared a plurality of kinds of external input/output terminal portions having respective external connection portions disposed in various directions.

In the electric distribution box A of the above construction, the mounting portions 12b are fixed by the screws by the mounting member such as a frame of the vehicle such as a hybrid car, an electric car or a fuel cell car, and the wire harnesses B (which are connected to the battery, the ignition switch, the inverter, etc., and are installed in the vehicle) are connected respectively to the external connection portions 2b (2b'). At this time, one of the external input/output terminal portions 2, 2', ... which can be easily connected to the wire harnesses B is selected so that the direction of installation of the wire harnesses B coincides with the direction of the external input/output terminal portion, and the selected external input/output terminal portion is mounted on the bracket portions 12c of the case body 1. Thus, the electric distribution box A of this embodiment can be easily and positively connected to the wire harnesses B without additionally preparing an electric distribution box of different specifications even when the direction of installation of the wire harnesses B varies.

Although the electric distribution box A of this embodiment has been described above, this is merely one preferred embodiment of the invention, and the invention is not limited to this embodiment, and various modifications can be made without departing from the subject matter of the invention.

For example, in the electric distribution box A of this embodiment, although there are prepared the plurality of kinds of external input/output terminal portions having the respective external connection portions 2b (2b') disposed respectively in different positions, a plurality of external connection portions, disposed in different directions, can be provided at a plurality of portions of the external input/output terminal portion.

The present application is based on Japan Patent Application No. 2005-000000 filed on Apr. 15, 2005, the contents of which are incorporated herein for reference.

What is claimed is:

1. An electric distribution box, comprising:
   a circuit which is operable to perform the flowing, interruption and detection of electric current, and the circuit having distribution parts and a first bus bar which connects the distribution parts;
   a case body, in which the circuit is contained;
   a bracket portion which is formed so as to be projected from a side face of the case body and on which an end portion of the first bus bar is arranged; and
   an external input/output terminal portion which is detachably mounted on an outer surface of the case body, and is adapted to be connected to the end portion of the first bus bar,
   wherein the external input/output terminal portion includes a second bus bar, and
   wherein the second bus bar includes:
      a bus bar connecting portion which is connected to the end portion of the first bus bar; and
      an external connection portion for electrically connecting to an external member, which is continuous to the bus bar connecting portion, and is bent with respect to an upper face of the bracket portion so as to be parallel to the side face of the case body where the bracket portion is protruded,
   wherein the external connection portion is configured to be placed into direct contact with the external member.

2. The electric distribution box according to claim 1, wherein
   the external input/output terminal portion is configured to be connected to an external wire harness extending from an arbitrary direction.

3. The electric distribution box according to claim 2, wherein
   the external connection portion of the second bus bar is configured for threaded connection to the external wire harness.

4. The electric distribution box according to claim 1, wherein the case body includes:
   a lower case, wherein the bracket portion projects horizontally from one end thereof; and
   an upper case detachably engaged with the lower case;
   wherein the end portion of the first bus bar is disposed at the bracket portion; and
   wherein the external input/output terminal portion is mounted on the bracket portion.

5. The electric distribution box according to claim 2, wherein
   the external input/output terminal portion is a first external input/output terminal portion; and
   further comprising a second external input/output terminal portion, which is different from the first external input/output terminal portion in a positional relation between the bus bar connecting portion and the external connection portion,
   wherein in accordance with the external wire harness extending from an arbitrary direction, one of the first and second external input/output terminal portions is selected, and is mounted on the bracket portion.

6. The electric distribution box according to claim 1, wherein a plurality of end portions of the first bus are arranged on the upper face of the bracket portion;
   wherein the external input/output terminal portion includes:
      a plurality of the bus bar connecting portions which are respectively connected to the end portions of the first bus bar; and
      a plurality of the external connection portions which are respectively continuous to the bus bar connections; and
   wherein a first external connection portion includes a face that lies in a same plane as a face of a second external connection portion.

7. An electric distribution box, comprising:
   a circuit which is operable to perform the flowing, interruption and detection of electric current, and the circuit having distribution parts and a first bus bar which connects the distribution parts;
   a case body, in which the circuit is contained;
   a bracket portion which is formed so as to be projected from a side face of the case body and on which an end portion of the first bus bar is arranged,
      wherein the bracket portion covers only a portion of the side face of the case body; and
   an external input/output terminal portion which is detachably mounted on an outer surface of the case body, and is adapted to be connected to the end portion of the first bus bar,
   wherein the external input/output terminal portion includes a second bus bar, and
   wherein the second bus bar includes:
      a bus bar connecting portion which is connected to the end portion of the first bus bar; and
      an external connection portion for electrically connecting to an external member, which is continuous to the bus bar connecting portion, and is bent with respect to an upper face of the bracket portion so as to be parallel to the side face of the case body where the bracket portion is protruded.

* * * * *